United States Patent [19]

Sasaki et al.

[11] Patent Number: 6,147,865
[45] Date of Patent: Nov. 14, 2000

[54] CABINET FOR NUMERICAL CONTROLLER

[75] Inventors: Kazuyuki Sasaki, Higashiyatsushiro-gun; Kazuhiko Hirano; Yutaka Muraoka, both of Oshino-mura, all of Japan

[73] Assignee: Fanuc Ltd., Yamanashi, Japan

[21] Appl. No.: 09/269,068

[22] PCT Filed: Jul. 18, 1998

[86] PCT No.: PCT/JP98/03252

§ 371 Date: Mar. 18, 1999

§ 102(e) Date: Mar. 18, 1999

[87] PCT Pub. No.: WO99/04609

PCT Pub. Date: Jan. 28, 1999

[30] Foreign Application Priority Data

Jul. 18, 1997 [JP] Japan .................................. 9-208305

[51] Int. Cl.⁷ .................................................... H05K 7/20
[52] U.S. Cl. ......................... 361/695; 361/687; 361/690; 174/16.1; 454/184; 165/104.33
[58] Field of Search ..................... 361/683, 685, 361/687–689, 690–695, 697, 724–727, 798, 719, 720; 454/184, 223, 182.1, 187; 415/213.1, 223.1; 165/104.33, 80.2, 104.31, 104.32; 174/16.1, 16.3, 252; 257/706–727

[56] References Cited

U.S. PATENT DOCUMENTS

| 4,710,851 | 12/1987 | Pastecki ................................. 361/384 |
| 4,744,005 | 5/1988 | Milani ..................................... 361/384 |
| 4,869,681 | 9/1989 | Vache et al. ............................. 439/341 |
| 5,097,386 | 3/1992 | Byell et al. ............................. 361/384 |
| 5,562,410 | 10/1996 | Sachs et al. ......................... 415/213.1 |
| 5,772,500 | 6/1998 | Harvey et al. .......................... 454/184 |
| 6,042,474 | 3/2000 | Harvey et al. .......................... 454/184 |
| 6,064,571 | 5/2000 | Noble ..................................... 361/695 |

FOREIGN PATENT DOCUMENTS

| 59 78670 | 5/1984 | Japan . |
| 3-17686 | 2/1991 | Japan . |
| 7-7188 | 1/1995 | Japan . |
| 07 153439 | 6/1995 | Japan . |
| 8-46379 | 2/1996 | Japan . |

*Primary Examiner*—Leo P. Picard
*Assistant Examiner*—Michael Datskovsky
*Attorney, Agent, or Firm*—Staas & Halsey LLP

[57] ABSTRACT

A casing structure for a numerical control unit in which a cooling fan mounted on a fan cover is electrically connected with a control board attached to a main cover without using cables. A terminal unit connected with wiring of a fan motor is fixed to a fan cover, and a power supply terminal to be directly connected with the terminal unit is fixed to an upper end portion of a main control board The terminal unit is connected with or disconnected from the power supply terminal by attaching or detaching the fan cover to or from a casing body. Since cables are not needed for connection, a casing can be assembled and disassembled easily. Further, since an assembling error due to interference of cables is eliminated, automation of the assembling work can be easily achieved.

13 Claims, 6 Drawing Sheets

CABINET FOR NUMERICAL CONTROLLER

DESCRIPTION

1. Field of the Invention

The present invention relates to an improvement of a casing structure for a numerical control unit.

2. Description of the Related Art

There is already known a casing structure for a numerical control unit comprising a casing body, a main cover and a sub-cover for closing a front opening of the casing body, and a fan cover attached to a top of the casing body.

Generally, in this kind of casing structure, a cooling fan is mounted on the fan cover, which is to be attached to the top of the casing body, to thereby form a unit, and installation of the cooling fan to the casing body is performed simultaneously with attachment of the fan cover to the casing body. However, it is necessary to connect wiring of the cooling fan to a power supply terminal on a control board attached to the main cover, with cables. Thus, if the casing is to be assembled by hand, a cumbersome work is needed in arranging the cables, and if the casing is to be assembled by an automated operation, an assembling error may happen due to interference of the cables.

SUMMARY OF THE INVENTION

An object of the present invention is to provide a casing structure for a numerical control unit in which a cooling fan mounted on a fan cover is electrically connected with a control board attached to a main cover without using cables.

A casing structure for a numerical control unit of the present invention comprises: a casing body, a front cover for closing a front opening of the casing body, a fan cover attached to a top of the casing body, a control board attached to the front cover, a guide rail provided inside the casing for inserting and fixing the control board, locking members having release mechanisms provided at fitting portions of the covers and the casing body, a connection board provided on a rear side of the casing body and connected with a terminal on the control board, a cooling fan mounted on the fan cover, a terminal fixed to the fan cover and connected with wiring of the cooling fan, and a power supply terminal fixed to an upper end portion of the control board attached upright to the front cover, to be directly connected with the terminal fixed to the fan cover.

The casing structure for a numerical control unit of the present invention may further comprise: a lock mechanism provided between the fan cover and the control board attached to the front cover or between the fan cover and the front cover, to allow the front cover and the control board to be attached or detached only when the fan cover is detached. With this structure, the terminal fixed to the fan cover and the power supply terminal on the control board attached to the main cover is prevented from being damaged while the casing is assembled by hand or while the casing is disassembled and assembled for maintenance.

The front cover may be formed of synthetic resin, and a stay for attaching and detaching the control board may be formed integrally with the front cover. The stay has a support portion for supporting both sides of the control board and the support portion has a resilient tongue with a dowel at an end thereof to be fitted in a hole provided in the control board.

The front cover may comprise a main cover and a sub-cover. In this case, the power supply terminal to be connected with the terminal on the fan cover is fixed to the control board attached to the main cover, and the lock mechanism is provided between the fan cover and the control board attached to the main cover or between the fan cover and the main cover.

BRIEF DESCRIPTION OF DRAWINGS

FIGS. 5*a* to 5*c* show how a sub-cover and a sub-control board are attached, of which FIG. 5*b* is a front view of the sub-cover and the sub-control board, FIG. 5*c* a side view thereof, and FIG. 5*a* an enlarged cross-sectional view parallel to a plan view, showing how a locking member provided at the sub-cover is fitted into a casing body; and FIGS. 6*a* and 6*b* show how a main control board is attached to a main cover, of which FIG. 6*b* is an enlarged view of a stay provided at the main cover and the main control board, and FIG. 6*a* a cross-sectional view parallel to a plan view of FIG. 6*a*.

DESCRIPTION OF THE PREFERRED EMBODIMENTS

Figure 1:
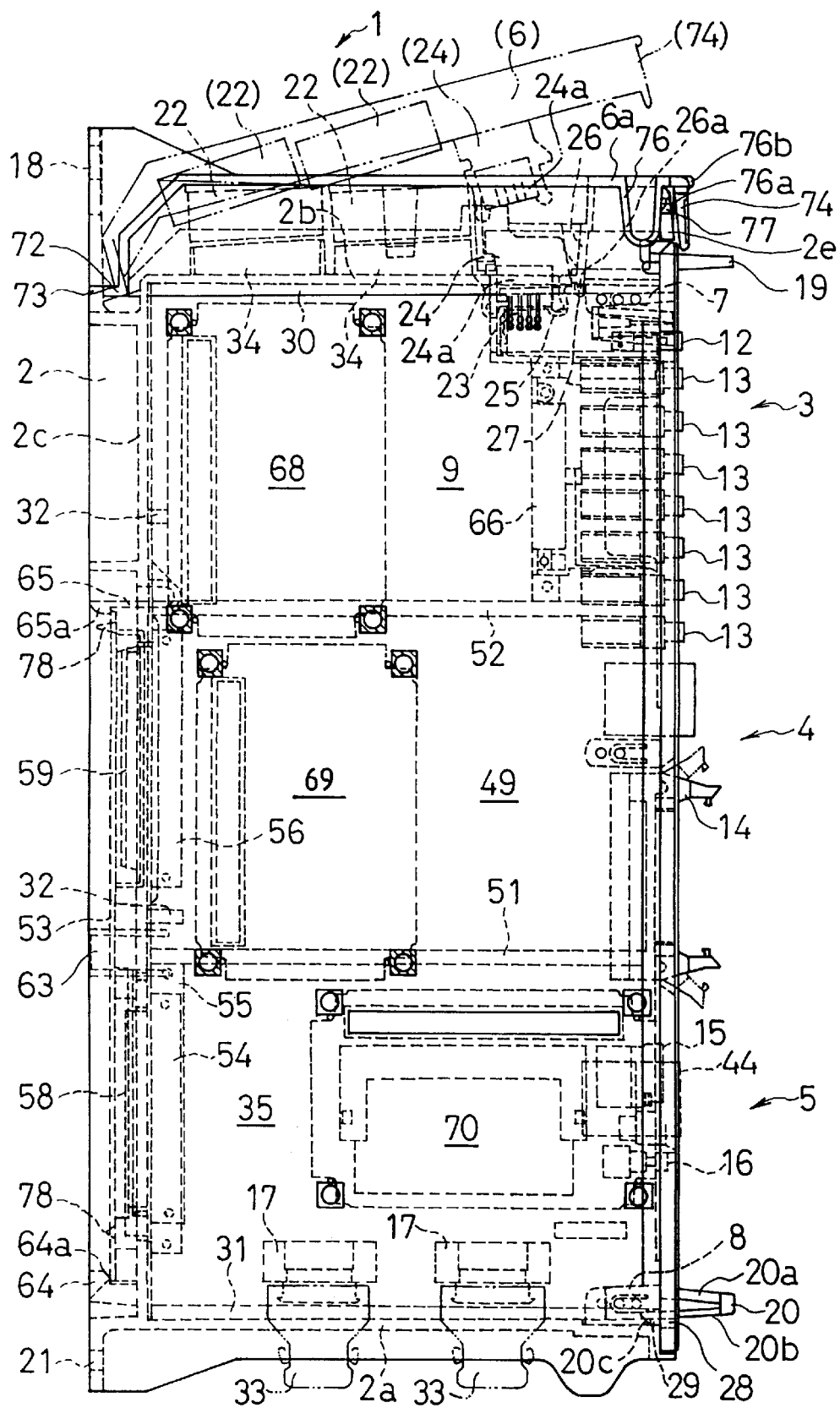
FIG. 1 is a left side view showing an embodiment of a casing for a numerical control unit according to the present invention in a see-through manner.

As shown in FIGS. 1 to 4, a main part of a casing 1 comprises a bottom portion 2*a*, a top portion 2*b*, a rear portion 2*c*, a left side portion 2*d*, a right side portion 2*f* and a front portion 2*e*, and is comprised of a casing body 2 of synthetic resin, a front cover consisting of a main cover 3 and sub-covers 4, 5 for closing a front opening of the casing body 2, and a fan cover 6 to be attached to the top of the casing body 2.

Figure 2:
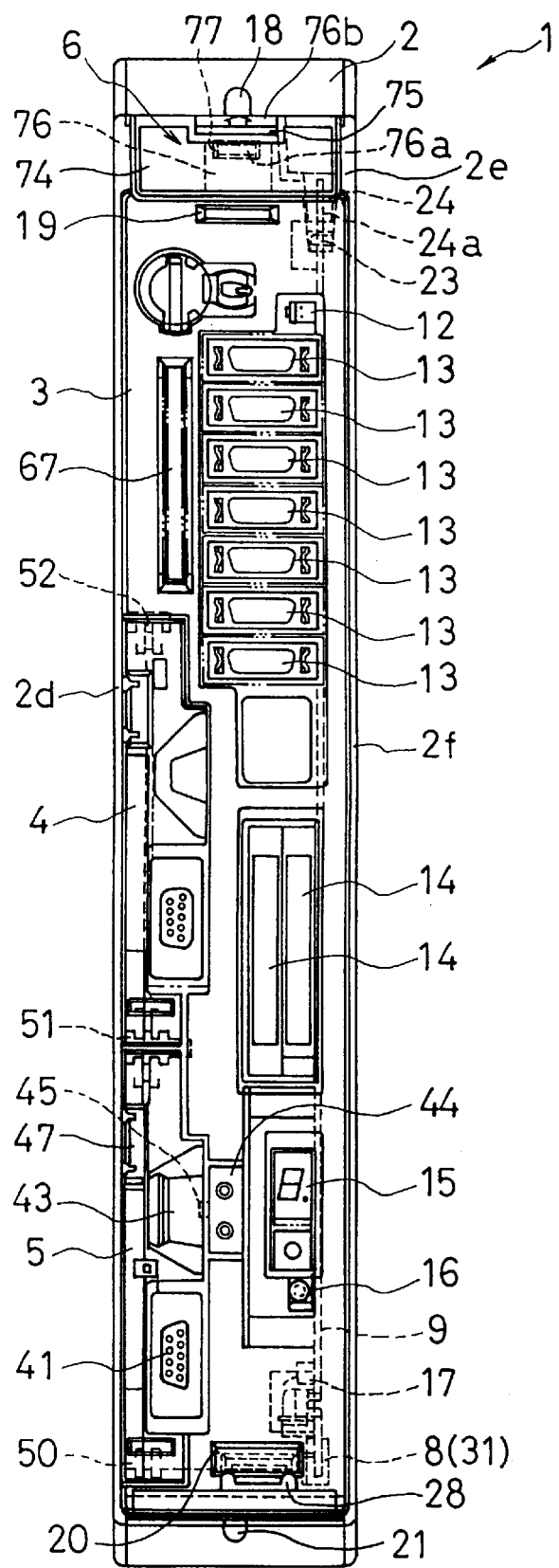
FIG. 2 is a front view showing a main part of the casing of FIG. 1 in a see-through manner.

On the rear face of the main cover 3, at upper and lower end portions thereof, stays 7, 8 for use in attaching a main control board are provided to the right as viewed from the front, as shown in FIGS. 1 and 2. A main control board 9 which is a rectangular shape and approximately the same size as the cross-section of the casing body 2 parallel to the side face thereof is set up on the rear face of the main cover 3 in a manner that it is fixed by the stays 7, 8 at its upper and lower ends.

Figure 6A:
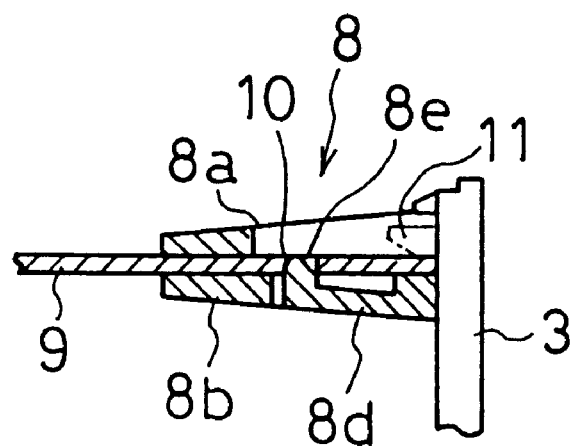
Figure 6B:
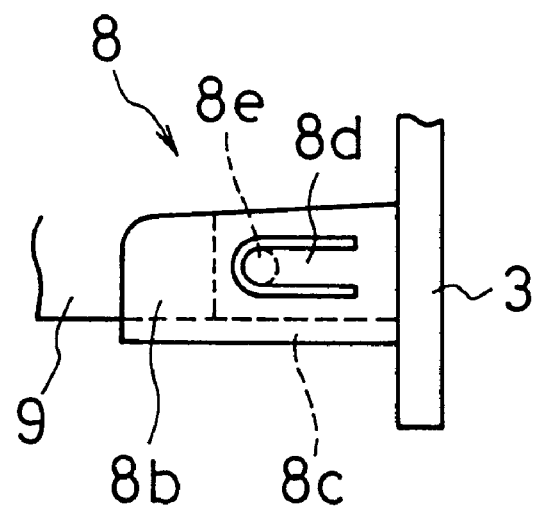

The stay 8 is formed of synthetic resin integrally with the main cover 3, and comprises, as shown in FIGS. 6*a* and 6*b*, support portions 8*a*, 8*b* for supporting the main control board 9 on both sides thereof, and a support portion 8*c* for supporting the lower end of the main control board 9. In the central portion of the support portion 8*b*, a tongue 8*d* is formed by making a slit of a horseshoe shape. At the tip of the tongue 8*d*, on the inside face thereof, a dowel 8*e* having a tapered face at its tip is formed to project. The dowel 8*e* projects into a hole 10 bored in the main control board 9 and thereby prevents the main control board 9 from falling off the stay 8.

The main control board 9 is attached to the main cover 3 only by pushing the main control board 9 into the stay 8 in a manner that the corner of the main control board 9 is guided by the inside faces of the support portions 8*a*, 8*b*, 8*c* of the stay 8. Due to wedge effect of the tapered face of the dowel 8*e* which slides on the edge of the board 9, the dowel 8*e* is automatically raised along the face of the board 9 to thereby recede from the way of the board 9. When the board 9 is completely inserted in the stay 8, the dowel 8e returns resiliently and projects into the hole 10, so that the board 9 is locked in the stay 8.

The other stay 7 having the formation similar to that of the stay 8 is provided at the upper end portion of the rear face of the main cover 3 to be opposite to the stay 8.

A projection 11 shown in FIG. 6a is a rib adapted to hold the side end portion of the main control board 9 to thereby prevent a warp of the board 9. A number of such projections are provided on the rear face of the main cover 3 along the side end portion of the main control board 9 at appropriate intervals.

Since the main cover 3 is integrally molded of synthetic resin, including the stays 7, 8, projections 11, and the like, the production cost is low. Further, since the stays 7, 8 can fix the main control board 9 by virtue of the tongues which are formed integrally with the stays 7, 8, fixing means such as screws, rivets or the like are not needed. Further, since the main control board 9 can be fixed very easily only by pushing the main control board 9 in, assembling can be carried out easily by hand. Furthermore, it is also easy to automate assembling work using machines, since the assembling is completed only by simply pushing the control board in, without using screws, rivets or the like.

At the side end portion of the main control board 9 are fixed various connectors 12, 13, 14 for use in connection of parallel cables, in connection to a servo amplifier and the like, an LED 15 for displaying numerical information, a push switch 16 and the like. Openings for allowing access to the connectors 12, 13, 14 and the push switch 16 and for allowing visual observation of the LED 15 are bored in the main cover 3 at the corresponding positions.

At the upper end portion of the main control board 9, a cutout 25 is provided in accordance with the shape of a tip of a terminal unit 24 fixed to the fan cover 6, and facing the cutout 25, a power supply terminal 23 is fixed to the board 9. At the tip of the terminal unit 24 is provided a terminal 24a which is connected with wiring of fan motors 22 (having a cooling fan) fixed to the fan cover 6. When the fan cover 6 is closed, the terminal 24a fixed to the fan cover 6 is brought in electrical contact with the power supply terminal 23 fixed to the main control board 9, so that driving power is supplied from the main control board 9 to the fan motors 22.

At the upper end portion of the main control board 9, at a position close to the main cover 3 is provided a cutout 27 which is part of a lock mechanism. When the fan cover 6 is closed, a tip projection 26a of a rib 26 extending downward from the fan cover 6 projects into the cutout 27.

At a position slightly lower than the cutout 27 is provided a connector 66, and an opening for access to an insertion opening 67 of the connector 66 is bored in the main cover 3. In addition to the above, small boards 68, 69, 70 are overlaid on this side of the main control board 9 as viewed in FIG. 1 and fixed to the main control board 9 using spacers, screws and nuts.

On the front face of the main cover 3, a handle 19 for use in detaching the main cover 3 is integrally formed at the upper end portion thereof, and a locking member 20 which serves also as a handle is integrally formed at the lower end portion thereof.

The locking member 20 is formed in a manner that it projects from the lower end portion of the main cover 3, like a letter "V". One leg 20a of the locking member is integrally connected with the main cover 3. The other leg 20b thereof extends through a hole 28 bored in the main cover 3 beyond the rear face of the cover 3, and a tapered projection 20c formed at the tip of the leg 20b is fitted in a stepped portion 29 formed at the bottom portion 2a of the casing body 2 to thereby prevent the main cover 3 from falling off. In order to release the projection 20c from the stepped portion 29, it is only necessary to hold and press the legs 20a, 20b of the locking member 20 in the vertical direction to thereby deform the locking member resiliently in a manner that the leg 20b is drawn up to the leg 20a to thereby disengage the projection 20c from the stepped portion 29 (a quick release mechanism).

Figure 3:
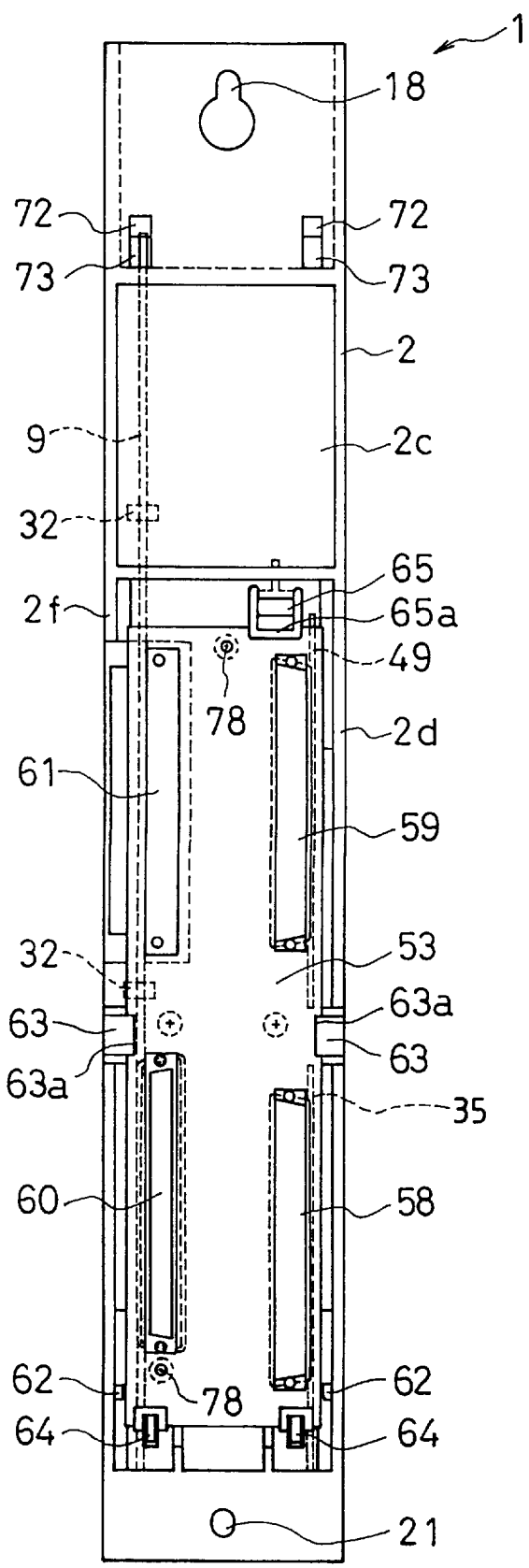
FIG. 3 is a rear view showing a main part of the casing of FIG. 1 in a see-through manner.

At the lower end portion of the main control board 9 are fixed connectors 17 for use in connection of RS232C cables or the like. In the bottom portion 2a of the casing body 2, openings for letting in cable connectors 33 to be connected with the connectors 17 are bored at the positions corresponding to the connectors 17. As shown in FIGS. 2 and 3, a hook hole 18 is bored in the upper end portion of the rear wall of the casing body 2, and actually, the connectors 17 can be used only when the casing is used in a manner that it is suspended using the hook hole 18. In the lower end portion of the rear wall of the casing body 2, a hole 21 is bored so that a nail, a screw, a bolt or the like planted in a wall may be let though the hole 21 to prevent the suspended casing 1 from tilting accidentally.

On the inside faces of the bottom and top portions 2a, 2b of the casing body 2, guide rails 31, 30 having grooves in which the lower and upper end portions of the main control board 9 are to be fitted are formed integrally. Thus, the main control board 9 can be inserted from the front opening of the casing body 2 along the guide rails 31, 30.

Further, on the inside face of the rear portion 2c of the casing 2, a projection 32 having a C-like cross section is formed integrally. The projection 32 is adapted to hold the side end portion of the main control board 9 on both sides when the main control board 9 has been completely pushed in, to thereby prevent a warp of the main control board 9.

The guide rail 30 formed at the top portion 2b is partially cut off at the positions corresponding to the cutouts 25, 27 of the main control board 9 to form vertical through-holes which allow the terminal unit 24 and the tip projection 26a of the rib 26 provided at the fan cover 6 to project therein. The guide rail 31 formed at the bottom portion 2a is partially cut off at the positions corresponding to the connectors 17 to form vertical through-holes which allow the cable connectors 33 to project therein. At the top portion 2b of the casing body 2, ducts 34 adapted to face the fan motors 22 are formed integrally with the casing body 2 to lead outside air fed by the fan motors 22 into the casing body 2.

Figure 5A:
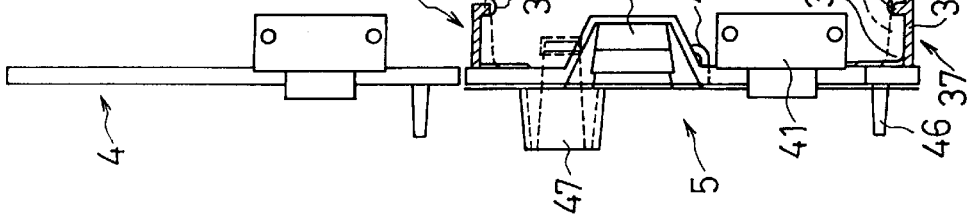
Figure 5B:
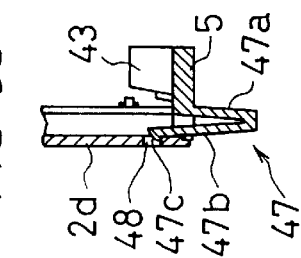
Figure 5C:
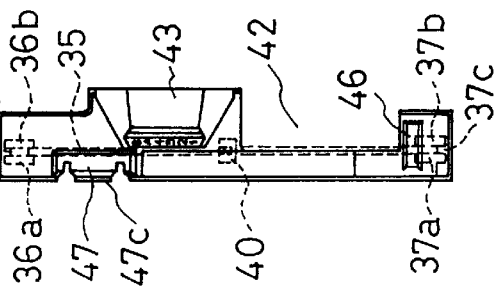

FIGS. 5a to 5c show details of a sub-cover 5 and a sub-control board 35. The sub-control board is a function expanding card used for improving the function of the numerical control unit, adding an additional function or the like.

On the rear face of the sub-cover 5, stays 36, 37 for use in attaching the sub-control board are provided at the upper and lower end portions thereof, and the sub-control board 35 of a rectangular shape is set up on the rear face of the sub-cover 5 in a manner that it is fixed by the stays 36, 37 at its upper and lower ends.

The stay 37 is formed of synthetic resin integrally with the sub-cover 5, and comprises, as shown in FIGS. 5b and 5c, support portions 37a, 37b for supporting the sub-control board 35 on both sides thereof, and a support portion 37c for supporting the lower end of the sub-control board 35. At the tip portion of the support portion 37c, a dowel 37d having a tip rounded to be a quadratic surface is formed to project. The dowel 37d projects into a cutout 38 formed in the sub-control board 35 and thereby prevents the sub-control board 35 from falling off.

The other stay 36 has a formation basically similar to that of the stay 37, except that the tip of a dowel 36d is not rounded. This is to prevent the cutout 38 from disengaging from the dowel 36d due to a clockwise angular moment as viewed in FIG. 5c which acts on the sub5 control board 35 when the sub-cover 5 is detached from the casing 1 and held by itself.

Thus, in order to attach the sub-control board 35 to the sub-cover 5, first the dowel 36d of the stay 36 is fitted in the cutout 38 on the upper side of the sub-control board 35, and then the lower end corner of the board 35 is pushed in in a manner that it is guided by the inside faces of the support portions 37a, 37b and the dowel 37d of the stay 37. Since the lower end corner of the board 35 comprises a rounded portion 39, when the lower end portion of the board 35 is only pushed in the stay 37, the rounded portion 39 of the board 35 slides on the rounded portion of the dowel 37d, and the rounded portion 39 of the board 35 and the rounded portion of the dowel 37d push each other. As a result, the stay 37 is resiliently deformed easily, and the dowel 37d is fitted and locked in the cutout 38.

A projection 40 shown in FIG. 5b is a rib for holding the side end portion of the sub-control board 35 to thereby prevent a warp of the board 35. The projection 40 is provided at an intermediate position between the stays 36, 37 along the side end portion of the sub-control board 9.

Since the sub-cover 5 is integrally molded of synthetic resin, including the stays 36, 37, the projection 40, and the like, the production cost is low. Further, since the stays 36, 37 can fix the sub-control board 35 by virtue of the dowels which are formed integrally with the stays 36, 37, fixing means such as screws, rivets or the like are not needed. Further, since the sub-control board 35 can be fixed very easily only by pushing the sub-control board 35 in, assembling can be carried out easily by hand. Furthermore, it is also easy to automate assembling work using machines, since the assembling is completed only by simply pushing the sub-control board in, without using screws, rivets or the like.

At the side end portion of the sub-control board 35 is fixed a connector 41, and a cutout 42 for allowing access to the connector 41 is formed in the sub-cover 5 at the corresponding position. A recess 43 of a hood-like shape is a clearance for allowing fingertips to approach and handle a knob 45 (FIG. 2) provided for unlocking an optical cable connector 44 (FIGS. 1 and 2) fixed on the main cover 3.

On the front face of the sub-cover 5, a handle 46 for use in detaching the sub-cover 5 is integrally formed at the lower end portion thereof, and a locking member 47 which serves also as a handle is integrally formed at the upper end portion thereof.

The locking member 47 has a formation similar to that of the locking member 20 of the main cover 3. A tapered projection 47c formed at the tip of a leg 47 is fitted in a slit 48 formed in the left side portion 2d of the casing body 2 to thereby prevent the sub-cover 5 from falling off. In order to release the projection 47c from the slit 48, it is only necessary to hold and press legs 47a, 47b of the locking member 47 in the horizontal direction to thereby deform the locking member 47 resiliently in a manner that the leg 47b is drawn up to the leg 47a to thereby disengage the projection 47c from the slit 48 (a quick release mechanism).

Since the sub-cover 4 has a formation similar to that of the sub-cover 5, the explanation thereof will be omitted. Generally, the sub-control board 35 to be attached to the sub-cover 5 and the sub-control board 49 to be attached to the sub-cover 4 have functions different from each other.

On the inside face of the left side portion 2d of the casing body 2, a guide rail 50 having a groove in which the lower end portion of the sub-control board 35 is to be fitted, a guide rail 51 having upper and lower grooves in which the lower end portion of the sub-control board 49 and the upper end portion of the sub-control board 35 are to be fitted, respectively, and a guide rail 52 having a groove in which the upper end portion of the sub-control board 49 is to be fitted are formed integrally with the casing body 2. Thus, the sub-control board 35 and the sub-control board 49 are inserted from the front opening of the casing body 2 along the guide rails 50, 51 and the guide rails 51, 52, respectively.

As shown in FIG. 3, in a rear opening which occupies about two thirds of the rear portion 2c of the casing body 2 on the lower side is fixed a distribution board 53 for use in wiring for connecting terminals of the main control board 9 or each sub-control board 35, 49 to an external device, connecting the main control board 9 and each sub-control board 35, 49 with each other, or connecting the sub-control boards 35, 49 with each other.

As shown in FIG. 3, an intermediate connector 58 for connection with the terminal 54 (shown in FIGS. 1 and 5c) of the sub-control board 35, an intermediate connector 59 for connection with the terminal 56 (shown in FIG. 1) of the sub-control board 49, and an intermediate connector 60 for connection with the terminal 55 (shown in FIG. 1) of the main control board 9 are fixed on the distribution board 53, and the terminals 54, 56, 55 of the control boards can be automatically connected with the intermediate connectors 58, 59, 60 of the distribution board 53 only by inserting the sub-control boards 35, 49 and the main control board 9 into the casing body 2 to which the distribution board 53 has been fixed.

Such way of connection is already known. Generally, each of the terminals 54, 56, 55 of the control boards is made of printed wiring or the like formed on each control board, and each of the intermediate connectors 58, 59, 60 of the distribution board 53 is made of a group of terminals such as a row of pressed metal terminals of a V-like shape adapted to nip the printed wiring.

The connectors 17, 17 provided at the lower end portion of the main control board 9 are for use in external connection. Reference numeral 61 denotes a test connector accessible from the side of the casing body.

As shown in FIGS. 1 and 3, at the opening portion of the rear portion 2c of the casing body 2 of synthetic resin are provided, integrally with the casing body 2, ribs 62 for supporting the distribution board 53 on its peripheral and rear sides, and at the lower end portion of the rear portion 2c are provided, integrally with the casing body 2, projections 64 for supporting the lower end portion of the distribution board 53 on its front side. In order to attach the distribution board 53 to the rear portion 2c of the casing body 2, first the distribution board 53 is tilted and set on the projections 64 with its front face of its lower end portion leaning on the inside slant faces 64a of the projections 64. Then, the distribution board 53 is swung clockwise as viewed in FIG. 1 in a manner that the distribution board 53 is guided by the ribs 62 on both sides thereof. Finally, the distribution board 53 is locked by the locking members 65, 63 integrally formed at the rear portion 2c of the casing body 2 in a manner that the end portions of the distribution board 53 are fitted behind tapered projections 65a, 63a of the locking members 65, 63 from the front side.

Since the projections 65a, 63a of the locking members 65, 63 are tapered, when the distribution board 53 is only swung and pushed to the rear portion 2c of the casing body 2, the end portions of the distribution board 53 slide on the tapered faces of the projections, and the end portions of the distribution board 53 and the tapered faces of the projections push each other. As a result, the locking members 65, 63 are resiliently deformed easily, and the distribution board 53 is fitted behind the rising portions of the projections 65, 63 and locked thereby.

In order to detach the distribution board 53 from the casing body 2, it is only necessary to raise up the projections 65*a*, 63*a* of the locking members 65, 63 by fingers against their resilience to thereby release the end portions of the distribution board 53 from the projections 65*a*, 63*a*, and then to swing the distribution board 53 counterclockwise as viewed in FIG. 1 and to pull it out upward (a quick release mechanism).

Projections 78 planted in the rear portion 2*c* of the casing body 2 like spikes are positioning projections. The projections 78 are fitted in holes bored in the distribution board 53 at the corresponding positions so that the distribution board 53 can be positioned accurately relative to the rear portion 2*c* of the casing body 1. The lower projection 78 has a smaller height than the upper projection 78 for fear that it may be a hindrance when the lower end portion of the distribution board 53 is set on the inside slant face 64*a* of the projection 64 in order to attach the distribution board 53 or when the distribution board 53 is pulled out and detached.

Figure 4:
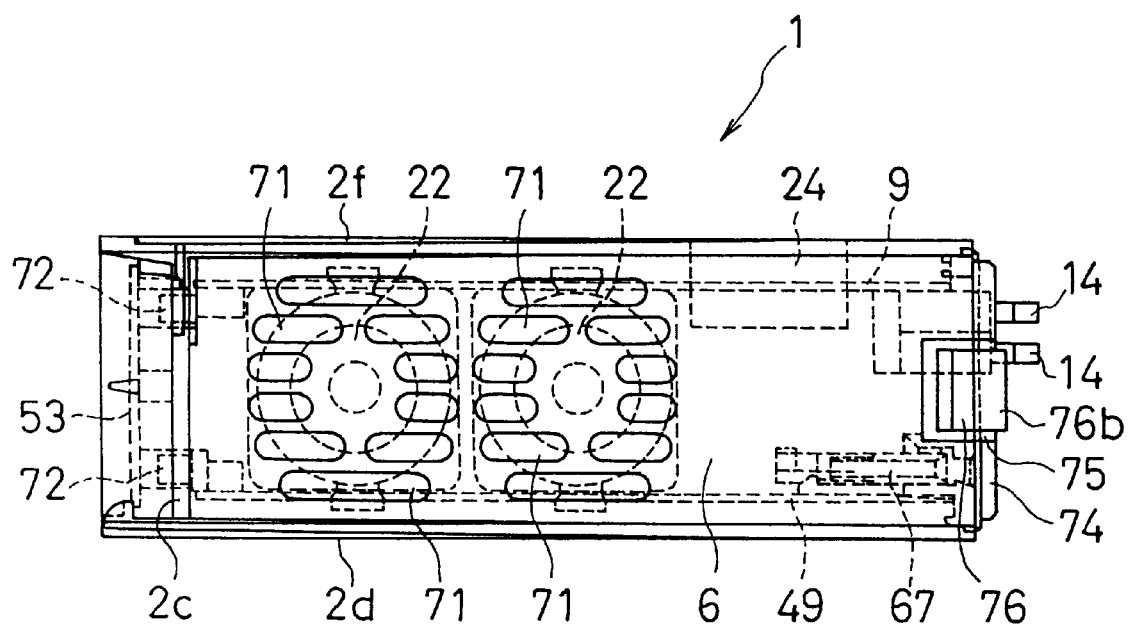
FIG. 4 is a plan view showing a main part of the casing of FIG. 1 in a see-through manner.

As shown in FIG. 4, in the top portion 6*a* of the fan cover 6 are bored a plurality of holes 71 for taking outside air in by fan motors 22. At both side end portions of the rear portion 2*c* of the fan cover 6 are integrally formed dowels 72 for use in attaching the fan cover 6 to the casing body 2. As shown in FIGS. 1 and 3, the dowels 72 are fitted in holes 73 of a rectangular shape bored in the rear portion 2*c* of the casing body 2.

At the end portion of the fan cover 6 located on the main cover 3 side is integrally formed a front hanging portion 74 arranged such that the tip portion thereof slightly overlaps the upper end portion of the main cover 3 on the front side when the fan cover 6 is closed. As shown in FIGS. 2 and 4, a cutout 75 is formed in the central portion of the front hanging portion 74.

At the top portion 6*a* of the fan cover 6 is integrally formed a locking member 76 of a U-like shape having a tapered projection 76*a* and a tip push portion 76*b*. As shown in FIGS. 1 and 4, the tip push portion 76*b* slightly projects forward from the cutout 75 of the front hanging portion 74. The projection 76*a* of the locking member 76 is, when the fan cover 6 is closed, fitted in a slit 77 made in the front portion 2*e* of the casing body 2 to thereby lock the fan cover 6. The front portion 2*e* of the casing body 2 located above the front opening of the casing body 2 is a horizontal strip-like portion rising upward from the top portion 2*b* of the casing body 2 or connecting with the left and right side portions 2*d*, 2*f* of the casing body 2.

In order to attach the fan cover 6, first the fan cover 6 is tilted as indicated by two-dot chain lines in FIG. 1, then the dowels 72 of the fan cover 6 are fitted in the holes 73 of the rear portion 2*c*, and then, in that state, the fan cover 6 is pushed downward and closed.

When the fan cover 6 is being closed, the projection 76*a* of the locking member 76 and the front hanging portion 74 of the fan cover 6 interfere with the upper edge of the front portion 2*e* of the casing body 2. However, since those portions are rounded, the projection 76*a* slides on the front portion 2*e* of the casing body, and the projection 76*a* and the front portion 2*e* push each other. As a result, the locking member 76 is resiliently deformed, and does not interfere with the front portion 2*e* any longer. When the fan cover 6 has been completely closed, the locking member 76 returns resiliently and the projection 76*a* comes into the slit 77 of the front portion 2*e* of the casing body 2. Thus, the fan cover 6 is locked in a manner that the rising portion of the projection 76*a* is fitted in the slit 77.

At that time, the tip of the terminal unit 24 of the fan cover 6 comes into the cutout 25 of the main control board 9 in a manner that it is guided by a reduced diameter portion of the cutout 25. Thus, the terminal 24*a* of the terminal unit 24 is connected with the power supply terminal 23 of the main control board 9, accurately. The tip projection 26*a* of the rib 26 of the fan cover 6 is fitted in the cutout 27 of the main control board 9, to thereby prevent the main control board 9 from being pulled out when the fan cover 6 is closed. Further, when the fan cover 6 is closed, the lower end portion of the front hanging portion 74 of the fan cover 6 covers the outside face of the upper end portion of the main cover 3. In addition to the tip end projection 26*a* fitted in the cutout 27, this also serves to prevent the main cover 3 from being detached, and therefore prevents the main control board 9 from being pulled out.

In order to detach the fan cover 6, it is only necessary to deform the locking member 76 resiliently by pushing the tip push portion 76*b* of the locking member 76 inward from the front side, to thereby release the projection 76*a* from the slit 77, and then to swing the fan cover 6 counterclockwise about the dowels 72 as viewed in FIG. 1, and then to pull the dowels 72 simply out of the holes 73 of the rear portion 2*c* (a quick release mechanism).

Next, how the entire casing 1 is assembled or disassembled for purposes of forwarding or maintenance.

First, the main cover 3 and the sub-covers 4, 5 to which the main control board 9 and the sub-control boards 49, 35 are attached, respectively, the fan cover 6 to which the fan motor 22 and the terminal unit 24 are attached, the distribution board 53 and the casing body 2 are prepared. Then, the distribution board 53, the main cover 3 and the sub-covers 4, 5, and the fan cover 6 are attached to the casing body 2 basically in this order to thereby assemble the casing 1.

The order can be somewhat changed, but it is necessary to make sure that the fan cover 6 is attached after the main cover 3 (main control board 9) has been attached. Since the terminal unit 24 fixed to the fan cover 6 is connected with the power supply terminal 2 fixed to the main control board 9 in a manner that an upper convex portion is fitted in a lower concave portion, if it is intended to insert the main control board 9 in the guide rails 31, 30 after the fan cover 6 has been attached to the casing body 2, the terminal unit 24 interferes with the main control board 9 and damage is caused.

In the present embodiment, when the fan cover 6 is attached to the casing body 6, the tip projection 26*a* of the rib 26 of the fan cover 6 projects through the guide rail 30 downward. Therefore, even if it is intended to insert the main control board 9 in the guide rails 31, 30 after the cover 6 has been attached to the casing body 2, the way of the main control board 9 is blocked by the tip projection 26*a* of the rib 26 which is located before the terminal unit 24. Therefore, the main control board 9 can not be inserted further, and the interference of the terminal unit 24 with the main control board 9 is prevented.

At that time, the left upper end portion of the main control board 9 as viewed in FIG. 1 collides with the tip projection 26*a* of the rib 26. However, since there are no electrical parts arranged at the left upper end portion of the main control board 9, damage is not caused to the main control board 9. The terminal unit 24 is also safe as it is protected by the tip projection 26*a* of the rib 26.

Thus, an error in assembling the casing by hand is prevented by preventing wrong procedure such that the main control board 9 is attached after the fan cover 6 is attached.

Further, the terminal unit 24 and the power supply terminal 23 through which the fan motor 22 and the main control board 9 are connected can be easily connected only by closing the fan cover 6 after the main control board 9 has been attached. Cables do not need to be arranged. Therefore, even if assembling is automated, defective assembling due to the interference of cables or the like cannot happen.

As already mentioned, the main control board 9 and the sub-control boards 49, 35 can be easily attached to the main cover 3 and the sub-covers 4, 5 only by pushing the boards 9, 49, 35 in the corresponding stays 7 and 8, 36, 37, respectively. Further, the main control board 9 and the sub-control boards 49, 35 can be easily electrically connected with the distribution board 53 attached to the casing body 2 only by inserting the boards 9, 49, 35 into the casing body 2. Further, only by simply pushing the covers 3, 4, 5, 6 in, the locking members 20, 47, 76 of the covers 3, 4, 5, 6 are fitted in the casing body 2, and the covers are thereby locked automatically. Thus, the assembling can be carried out with high efficiency, and it is also possible to automate the whole assembling procedure using machines.

In order to disassemble the casing 1, the fan cover 6, the sub-covers 4, 5, the main cover 3 and the distribution board 53 are detached from the casing body 2 basically in this order.

The order can be somewhat changed, but it is necessary to make sure that the main cover 3 (main control board 9) is detached after the fan cover 6 has been detached. This is to prevent the terminal unit 24 fixed to the fan cover 6 or the power supply terminal 2 fixed to the main control board 9 from being damaged as mentioned in respect of assembling.

In the present embodiment, when the assembling is completed and the fan cover 6 is closed, the tip projection 26a of the rib 26 of the fan cover 6 projects through the cutout 27 and thereby locks the main control board 9. In addition, the front hanging portion 74 of the fan cover 6 covers the upper end portion of the main cover 3 on the front side and thereby prevents the main cover 3 from being detached. In other words, the present embodiment is so arranged that in the process of disassembling the casing 1, the main control board 9 cannot be detached only after the fan cover is detached. Thus, the terminal unit 24 and the power supply terminal 23 are prevented from being damaged.

Further, the fan cover 6, the main cover 3, the sub-covers 4, 5 and the distribution board 53 can be easily detached in a manner that they are pulled out by handling the locking members 76, 20, 47, 63, 65 having quick release mechanisms. Therefore, disassembling for maintenance takes only a very short time.

According to the casing structure of the present invention, the terminal for the cooling fan fixed to the fan cover is directly connected with the power supply terminal provided on the control board attached to the main cover in order to drive the cooling fan. Therefore, cables for connecting the cooling fan and the power supply terminal on the control board are not needed any longer, and therefore, arrangement of such cables does not need to be considered, either. Thus, the fan cover can be attached or detached easily. Further, since there is no fear that cables may interfere with each other or become tangled with each other and cause defective assembling, the assembling can be easily automated with machines.

Further, between the fan cover and the control board attached to the main cover and between the fan cover and the main cover are provided lock mechanisms which allow the main cover and the control board to be attached or detached only when the fan cover has been detached. This prevents an error such that the control board is pushed in or pulled out with the fan cover being attached, and thereby prevents the terminal for the cooling fan or the power supply terminal from being damaged.

Further, each control board can be attached to the casing body by simple insertion using guide rails, and the covers on which the control boards are set up can also easily be attached to or detached from the casing body by the locking members having quick release mechanisms. Therefore, in the process of maintenance, assembling and disassembling can be carried out quickly and easily. It is also possible to automate the whole assembling.

What is claimed is:

1. A casing structure for a numerical control unit, comprising:
    a casing body;
    a fan cover to be attached to a top of said casing body;
    a control board accommodated in said casing body;
    a cooling fan mounted on said fan cover;
    a terminal fixed to said fan cover and connected with wiring of said cooling fan; and
    a power supply terminal fixed to an upper end portion of said control board, to be directly connected with said terminal fixed to said fan cover.

2. A casing structure for a numerical control unit, comprising:
    a casing body;
    a front cover to close a front opening of said casing body;
    a fan cover to be attached to a top of said casing body;
    a control board detachably attached to said front cover;
    a guide rail provided inside said casing to guide said control board during insertion and to fix said control board;
    locking members having release mechanisms provided at fitting portions of said covers and said casing body to releasably lock the covers;
    a cooling fan mounted on said fan cover;
    a terminal fixed to said fan cover and connected with wiring of said cooling fan; and
    a power supply terminal fixed to an upper end portion of said control board attached to said front cover, to be directly connected with said terminal fixed to said fan cover.

3. A casing structure for a numerical control unit according to claim 2, further comprising a lock mechanism provided between said fan cover and said control board attached to said front cover or between said fan cover and said front cover, to allow said main cover and said control board to be attached or detached only when said fan cover is detached.

4. A casing structure for a numerical control unit according to claim 2, wherein said front cover is formed of synthetic resin and a stay to attach and detach said control board is formed integrally with said front cover, said stay having a support portion to support both sides of said control board, and said support portion having a resilient tongue with a dowel at an end thereof to be fitted in a hole provided in said control board.

5. A casing structure for a numerical control unit according to claim 2, wherein said front cover comprises a main cover and a sub-cover, and said power supply terminal to be connected with said terminal on said fan cover is fixed to said control board attached to said main cover.

6. A casing structure for a numerical control unit according to claim 5, wherein said front cover and said sub-cover are formed of synthetic resin and stays to attach and detach said control board and respectively formed integrally with said front cover and said sub-cover, each of said stays having a support portion to support both sides of said control board, and said support portion having a resilient tongue with a dowel at an end thereof to be fitted in a hole provided in said control board.

7. A casing structure for a numerical control unit according to claim 2, wherein said front cover comprises a main cover and a sub-cover, and said casing structure further comprises a lock mechanism provided between said fan cover and said control board attached to said main cover or between said fan cover and said main cover, to allow said main cover and said control board to be attached or detached only when said fan cover is detached.

8. A casing structure for a numerical control unit as recited in claim 2, further comprising a connection board provided on a rear side of said casing body and connected with a terminal on said control board.

9. A casing structure for a numerical control unit, comprising:

a casing body;
   a front cover to close a front opening of said casing body;
   a fan cover to be attached to a top of said front cover;
   a control board detachably attached to said front cover;
   a guide rail provided inside said casing to guide said control board during insertion and to fix said control board;
   locking members having release mechanisms provided at fitting portions of said covers and said casing body;
   a connection board provided on a rear side of said casing body and connected with a terminal on said control board;
   a cooling fan mounted on said fan cover;
   a terminal fixed to said fan cover and connected with wiring of said cooling fan;
   a power supply terminal fixed to an upper end portion of said control board attached to said front cover, to be directly connected with said terminal fixed to said fan cover; and
   a lock mechanism provided between said fan cover and said control board attached to said front cover or between said fan cover and said front cover, to allow said main cover and said control board to be attached or detached only when said fan cover is detached.

10. A casing structure for a numerical control unit, comprising:

a casing body;
    a front cover to close a front opening of said casing body;
    a fan cover to be attached to a top of said front cover;
    a control board detachably attached to said front cover;
    a guide rail provided inside said casing to guide said control board during insertion and to fix said control board;
    locking members having release mechanisms provided at fitting portions of said covers and said casing body;
    a connection board provided on a rear side of said casing body and connected with a terminal on said control board;
    a cooling fan mounted on said fan cover;
    a terminal fixed to said fan cover and connected with wiring of said cooling fan;
    a power supply terminal fixed to an upper end portion of said control board attached to said front cover, to be directly connected with said terminal fixed to said fan cover; and
    wherein said front cover is formed of synthetic resin and a stay to attach and detach said control board is formed integrally with said front cover, said stay having a support portion to support both sides of said control board, and said support portion having a resilient tongue with a dowel at an end thereof to be fitted in a hole provided in said control board.

11. A casing structure for a numerical control unit, comprising:

a casing body;
    a front cover to close a front opening of said casing body;
    a fan cover to be attached to a top of said front cover;
    a control board detachably attached to said front cover;
    a guide rail provided inside said casing to guide said control board during insertion and to fix said control board;
    locking members having release mechanisms provided at fitting portions of said covers and said casing body;
    a connection board provided on a rear side of said casing body and connected with a terminal on said control board;
    a cooling fan mounted on said fan cover;
    a terminal fixed to said fan cover and connected with wiring of said cooling fan; and
    a power supply terminal fixed to an upper end portion of said control board attached upright to said front cover, to be directly connected with said terminal fixed to said fan cover; and
    wherein said front cover comprises a main cover and a sub-cover, and said power supply terminal to be connected with said terminal on said fan cover is fixed to said control board attached to said main cover.

12. A casing structure for a numerical control unit according to claim 11, wherein said front cover and said sub-cover are formed of synthetic resin and stays to attach and detach said control board are respectively formed integrally with said front cover and said sub-cover, each of said stays having a support portion to support both sides of said control board, and said support portion having a resilient tongue with a dowel at an end thereof to be fitted in a hole provided in said control board.

13. A casing structure for a numerical control unit, comprising:

a casing body;
    a front cover to close a front opening of said casing body;
    a fan cover to be attached to a top of said front cover;
    a control board detachably attached to said front cover;
    a guide rail provided inside said casing to guide said control board during insertion and to fix said control board;
    locking members having release mechanisms provided at fitting portions of said covers and said casing body;
    a connection board provided on a rear side of said casing body and connected with a terminal on said control board;
    a cooling fan mounted on said fan cover;
    a terminal fixed to said fan cover and connected with wiring of said cooling fan; and
    a power supply terminal fixed to an upper portion of said control board attached upright to said front cover, to be directly connected with said terminal fixed to said fan cover,
    wherein said front cover comprises a main cover and a sub-cover, and said casing structure further comprises a lock mechanism provided between said fan cover and said control board attached to said main cover or between said fan cover and said main cover, to allow said main cover and said control board to be attached or detached only when said fan cover is detached.

* * * * *

UNITED STATES PATENT AND TRADEMARK OFFICE
CERTIFICATE OF CORRECTION

PATENT NO.: 6,147,865
DATED : November 14, 2000
INVENTOR(S): Sasaki et al.

It is certified that errors appear in the above-identified patent and that said Letters Patent is hereby corrected as shown below:

[54] Delete the existing title and replace with --CASING STRUCTURE FOR NUMERICAL CONTROL UNIT--.

[57] line 7 of the text, after "board" insert --.--.

Column 5,
 line 47, change "handle a" to --a handle--.*

Column 10,
 line 49, after "resin" insert --,--.

Signed and Sealed this

First Day of May, 2001

Attest:

NICHOLAS P. GODICI

*Attesting Officer*  *Acting Director of the United States Patent and Trademark Office*